United States Patent
Bahl et al.

(10) Patent No.: US 8,502,273 B2
(45) Date of Patent: Aug. 6, 2013

(54) GROUP III-NITRIDE HEMT HAVING A WELL REGION FORMED ON THE SURFACE OF SUBSTRATE AND CONTACTED THE BUFFER LAYER TO INCREASE BREAKDOWN VOLTAGE AND THE METHOD FOR FORMING THE SAME

(75) Inventors: Sandeep Bahl, Palo Alto, CA (US); Constantin Bulucea, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 336 days.

(21) Appl. No.: 12/908,458

(22) Filed: Oct. 20, 2010

(65) Prior Publication Data

US 2012/0098035 A1    Apr. 26, 2012

(51) Int. Cl.
*H01L 29/778* (2006.01)
*H01L 21/338* (2006.01)

(52) U.S. Cl.
USPC ............ 257/194; 257/E21.403; 257/E29.246; 438/172

(58) Field of Classification Search
USPC .......... 257/194, 200, 201, E29.246, E21.403; 438/172
See application file for complete search history.

(56) References Cited

U.S. PATENT DOCUMENTS

| | | | |
|---|---|---|---|
| 3,029,366 | A | 4/1962 | Lehovec |
| 3,859,127 | A | 1/1975 | Lehner |
| 4,980,315 | A | 12/1990 | Einthoven et al. |
| 6,120,909 | A | 9/2000 | Bojarczuk, Jr. et al. |
| 8,314,447 | B2 * | 11/2012 | Hirler et al. .................. 257/194 |
| 2003/0102482 | A1 | 6/2003 | Saxler |
| 2006/0124960 | A1 * | 6/2006 | Hirose et al. ................. 257/189 |
| 2007/0018198 | A1 | 1/2007 | Brandes et al. |
| 2008/0230786 | A1 | 9/2008 | Heikman et al. |
| 2008/0296622 | A1 * | 12/2008 | Kiewra et al. ................. 257/194 |
| 2012/0153355 | A1 * | 6/2012 | Umeda et al. ................. 257/192 |

FOREIGN PATENT DOCUMENTS

EP    1826823 A2    8/2007

OTHER PUBLICATIONS

Umeda, H. et al., "Blocking-Voltage Boosting Technology for GaN Transistors by Widening Depletion Layer in Si Substrates", International Electron Devices Meeting (IEDM), Dec. 2010, pp. 480-483.

Tanaka, S. et al., "Electron-beam-induced-current investigation of GaN/AlGaN/Si heterostructures using scanning transmission electron microscopy", Journal of Electron Microscopy, 56(4), 2007, pp. 141-144.

Obreja, V.V.N., "The Semiconductor-Dielectric Interface from PN Junction Edge and the Voltage Dependence of Leakage Reverse Current", International Semiconductor Device Research Symposium (ISDRS), 2007, pp. 1-2 (unnumbered).

(Continued)

*Primary Examiner* — Anh Mai
(74) *Attorney, Agent, or Firm* — Eugene C. Conser; Wade J. Brady, III; Frederick J. Telecky, Jr.

(57) ABSTRACT

The buffer breakdown of a group III-N HEMT on a p-type Si substrate is significantly increased by forming an n-well in the p-type Si substrate to lie directly below the metal drain region of the group III-N HEMT. The n-well forms a p-n junction which becomes reverse biased during breakdown, thereby increasing the buffer breakdown by the reverse-biased breakdown voltage of the p-n junction and allowing the substrate to be grounded. The buffer layer of a group III-N HEMT can also be implanted with n-type and p-type dopants which are aligned with the p-n junction to minimize any leakage currents at the junction between the substrate and the buffer layer.

20 Claims, 7 Drawing Sheets

OTHER PUBLICATIONS

Obreja, V.V.N. et al., "Experimental Investigation on the Leakage Reverse Current Component Flowing at the Semiconductor PN Junction Periphery", 7th Int. Conf. on Thermal, Mechanical and Multiphysics Simulation and Experiments in Micro-Electronics and Micro-Systems, EuroSimE, 2006, pp. 1-6.

Mishra, U.K. et al., "AlGaN/GaN HEMTs—An Overview of Device Operation and Applications", Proceedings of the IEEE, vol. 90, No. 6, 2002, pp. 10221031.

Baliga, B.J., "Fundamentals of Power Semiconductor Devices", Springer Science, 2008, pp. 137-149.

U.S. Appl. No. 12/908,514, filed Oct. 20, 2010 to Sandeep Bahl et al. See IIS Transmittal Letter for Relevance.

PCT International Search Report for PCT/US2011/046065, Feb. 27, 2012.

PCT Written Opinion of the International Searching Authority for PCT/US2011/046065, Feb. 27, 2012.

* cited by examiner

GROUP III-NITRIDE HEMT HAVING A WELL REGION FORMED ON THE SURFACE OF SUBSTRATE AND CONTACTED THE BUFFER LAYER TO INCREASE BREAKDOWN VOLTAGE AND THE METHOD FOR FORMING THE SAME

BACKGROUND OF THE INVENTION

1. Field of the Invention

The present invention relates to Group III-N HEMTs and, more particularly, to a Group III-N HEMT with an increased buffer breakdown voltage.

2. Description of the Related Art

Group III-N high electron mobility transistors (HEMTs) have shown potential superiority for power electronics due to their wider bandgap and high electron saturation velocity. These material properties translate into high breakdown voltage, low on-resistance, and fast switching. Group III-N HEMTs can also operate at higher temperatures than silicon-based transistors. These properties make group III-N HEMTs well suited for high-efficiency power regulation applications, such as lighting and vehicular control.

FIG. 1 shows a cross-sectional view that illustrates a conventional group III-N HEMT 100. As shown in FIG. 1, group III-N HEMT 100 includes a substrate 110, and a layered region 112 that is formed on the top surface of the substrate 110. The layered region 112, in turn, includes a barrier layer 114 at the top, a channel layer 116 in the middle, and a buffer layer 118 at the bottom that lies between the substrate 110 and the channel layer 116. The barrier layer 114, the channel layer 116, and the buffer layer 118 are each typically implemented with one or more sequential group-III nitride layers, with the group-III including one or more of In, Ga, and Al. For example, the barrier layer 114 is commonly formed from AlGaN, while the channel layer 116 is commonly formed from GaN.

As discussed in Mishra et al., "AlGaN/GaN HEMTs—An Overview of Device Operation and Applications", Proceedings of the IEEE, Vol. 90, No. 6, June 2002, pp. 1022-1031, the channel layer and the barrier layer of an HEMT have different polarization properties and band gaps that induce the formation of a two-dimensional electron gas (2DEG) that lies at the top of the channel layer. The 2DEG, which has a high concentration of electrons, is similar to the channel in a conventional field effect transistor (FET).

Native group III-N substrates are not easily available, so the layered region 112 is conventionally grown on the substrate 110 using epitaxial deposition techniques such as metal organic chemical vapor deposition (MOCVD) and molecular beam epitaxy (MBE). The buffer layer 118 provides a transition layer between the substrate 110 and the channel layer 116 in order to address the difference in lattice constant and to provide a dislocation-minimized growing surface.

The substrate 110 is commonly implemented with SiC because SiC has a reasonably low lattice mismatch (~3%) and a high thermal conductivity. SiC substrates, however, are expensive and limited in size. The substrate 110 is also commonly implemented with Si due to the low cost of Si and access to Si processing infrastructure. Si substrates, however, limit the thickness of the buffer layer 118 to 2-3 um on a 6-inch substrate due to the stress and subsequent bowing of the wafer.

One of the limitations of a 2-3 um buffer thickness is that a thin buffer layer places a limit on the breakdown voltage of the device. This is because the buffer breakdown voltage is quite low. For instance, a 2 um thick buffer breaks down at 300V. One approach to increasing the buffer breakdown voltage is to float the substrate. By floating the substrate, the buffer breakdown voltage is doubled to 600V because the voltage is supported by two buffer layer thicknesses.

For example, as shown in FIG. 1, when a Si substrate is floated and the drain-to-source breaks down, the breakdown current follows a path from the drain to the source that includes the breakdown path segments A, B, and C. The breakdown path segments A and C each have a breakdown voltage of approximately 300V, whereas the breakdown path segment B is ohmic. Thus, in order to achieve the full breakdown voltage (600V), the substrate 110 must be able to float up to half the breakdown voltage (300V).

However, the requirement for a floating substrate poses a major concern for crosstalk due to capacitive coupling between devices. In addition, a floating substrate causes a major issue for packaging. If a conventional package is used, the group III-N HEMT is attached using a non-conductive epoxy. Non-conductive epoxies, however, have worse thermal conductivity than conductive epoxies. This will cause a serious problem, since the group III-N device is intended for power applications, and needs to have a good heat sink.

There are packages with improved heat sinking, which use an intermediate insulating layer with high thermal conductivity like AlN. However, these are expensive and still have lower thermal conductivity than direct-attach with a conductive epoxy. The voltage of a floating substrate is also not specified, since the substrate is not directly contacted. Unregulated voltages are not desirable in circuit design. Thus, there is a need for alternate approaches to forming group III-N HEMTS.

DETAILED DESCRIPTION OF THE INVENTION

FIGS. 2-6 show a series of cross-sectional views that illustrate an example of a method of forming a group III-N HEMT 200 in accordance with the present invention. As described in greater detail below, the method of the present invention forms a p-n junction in a silicon substrate under the drain to form a junction isolation barrier that acts in series with, and thereby increases, the buffer breakdown voltage.

Figure 1:
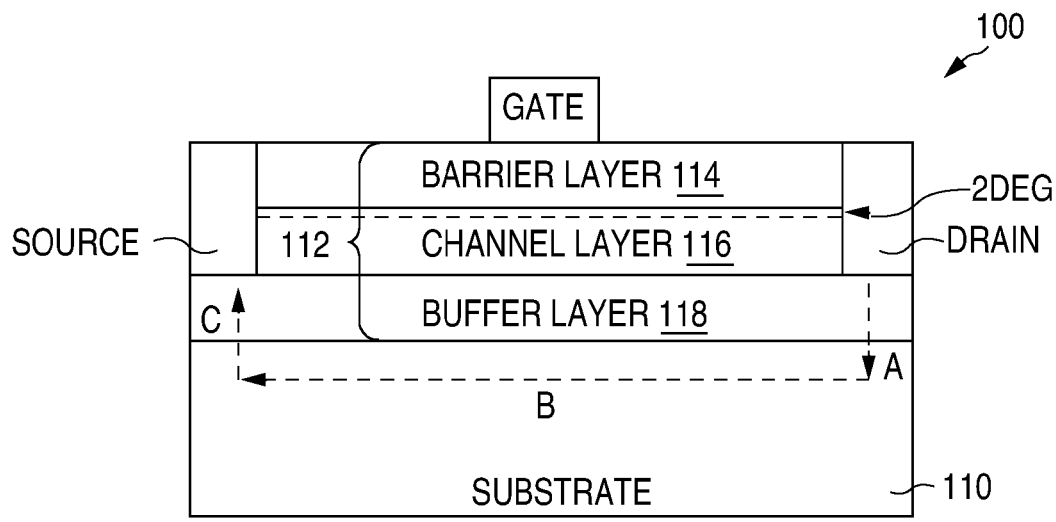
FIG. 1 is a cross-sectional view illustrating a conventional group III-N HEMT 100.
Figure 2:
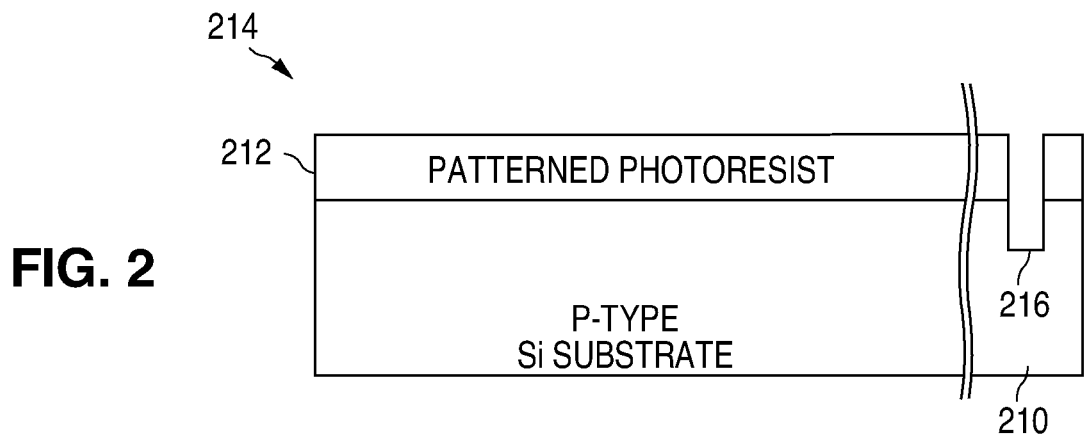
FIGS. 2-6 are a series of cross-sectional views illustrating an example of a method of forming a group III-N HEMT 200 in accordance with the present invention.

As shown in FIG. 2, the method of the present invention utilizes a conventionally-formed, single-crystal, lightly-doped, p-type Si semiconductor substrate 210 (e.g., <111>). As further shown in FIG. 2, the method of the present invention begins by forming a patterned photoresist layer 212 on the top surface of substrate 210.

The patterned photoresist layer 212 is formed in conventional manner, which includes depositing a layer of photoresist, projecting a light through a patterned black/clear glass plate known as a mask to form a patterned image on the layer of photoresist to soften the photoresist regions exposed by the light, and removing the softened photoresist regions. After the patterned photoresist layer 212 has been formed, the exposed regions of the substrate 210 are etched to form an intermediate HEMT structure 214 that includes an alignment mark 216. The patterned photoresist layer 212 is then removed.

Figure 3:
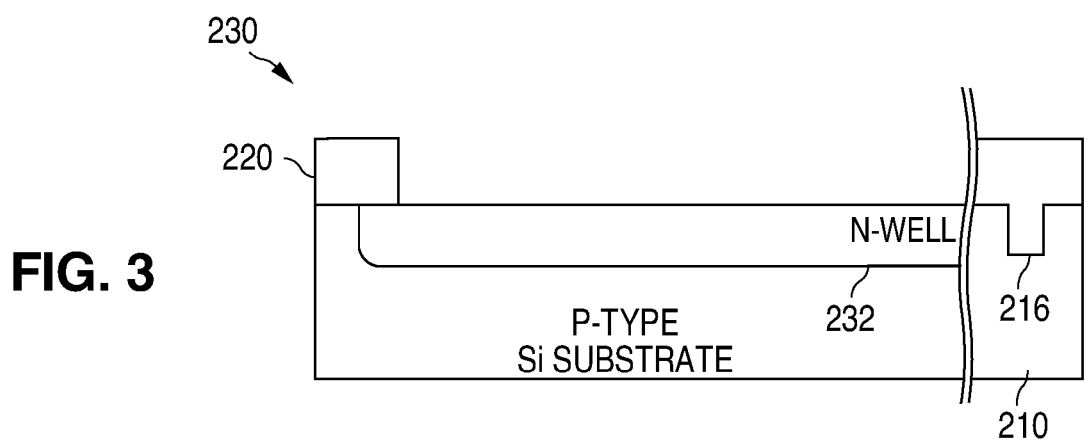

As shown in FIG. 3, following the removal of the patterned photoresist layer 212, a patterned photoresist layer 220 is formed on the top surface of the substrate 210 in a conventional manner. After the patterned photoresist layer 220 has been formed, an n-type dopant, such as phosphorous and/or arsenic, is implanted into the substrate 210 through the openings in the patterned photoresist layer 220. An anneal is next performed to diffuse and activate the implant, thereby forming an intermediate HEMT structure 230 that includes an n-well 232 in substrate 210. The patterned photoresist layer 220 is then removed.

Figure 4:
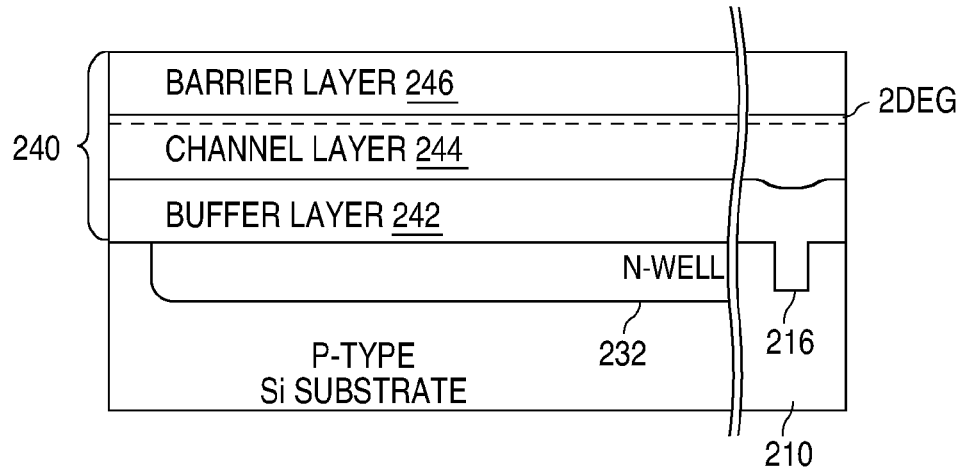

As shown in FIG. 4, once the patterned photoresist layer 220 has been removed, a layered region 240 is formed on the substrate 210. The layered region 240, in turn, includes a buffer layer 242, a channel layer 244, and a barrier layer 246. The buffer layer 242, the channel layer 244, and the barrier layer 246 can each be implemented with one or more sequential group-III nitride layers, with the group-III including one or more of In, Ga, and Al. For example, the buffer layer 242 can be implemented with sequential layers of AlN (a thermally-stable material), AlGaN, and GaN. In addition, the channel layer 244 can be implemented with, for example, GaN, and the barrier layer 246 can be implemented with, for example, AlGaN.

The layered region 240 can be formed in a conventional manner, such as by placing the intermediate HEMT structure 230 in a MOCVD reactor and epitaxially growing the buffer layer 242 on the top surface of the substrate structure 210, the channel layer 244 on the top surface of the buffer layer 242, and the barrier layer 246 on the top surface of the channel layer 244.

Figure 5:
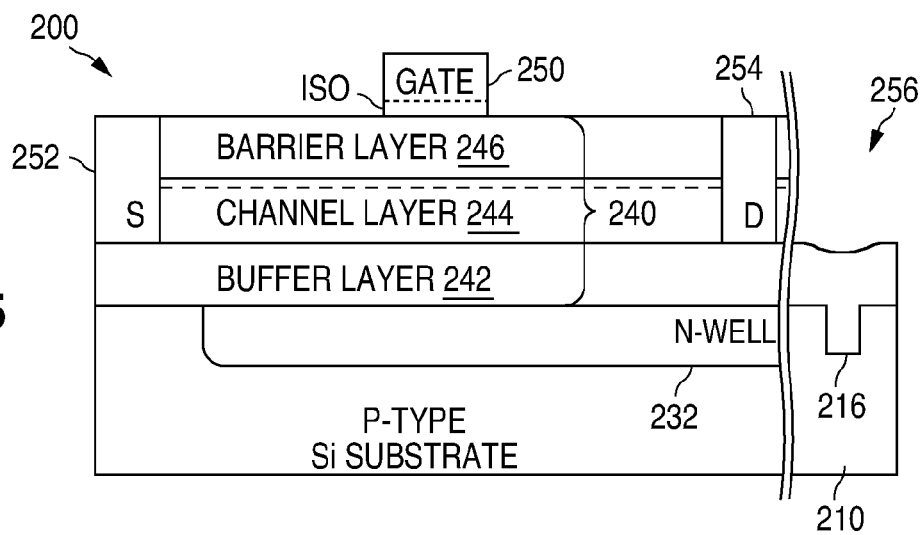

As shown in FIG. 5, following the conventional formation of the layered region 240, the method completes the formation of group III-N HEMT 200 by forming a metal gate region 250, a metal source region 252, and a metal drain region 254 in a conventional fashion, except that the alignment mark 216 is used to position the metal drain region 254 directly over the n-well 232.

The metal gate region 250 is formed to make a Schottky contact, while the metal source region 252 and the metal drain region 254 are formed to make an ohmic contact with the channel layer 244. Alternately, as shown by the dashed line in FIG. 5, the gate 250 can be isolated from the barrier layer 246 by an insulating layer ISO.

In addition, the method isolates adjacent devices by removing the barrier layer 246 and the channel layer 244 that lie over the alignment mark 216 and non-device regions. When the barrier layer 246 and channel layer 244 are removed from over the alignment mark 216 and non-device regions, the removal forms an opening 256, where the bottom of the opening 256 exposes a portion of buffer layer 242, and a side wall of the opening 256 exposes a portion of the channel layer 244 and barrier layer 246.

Figure 6:
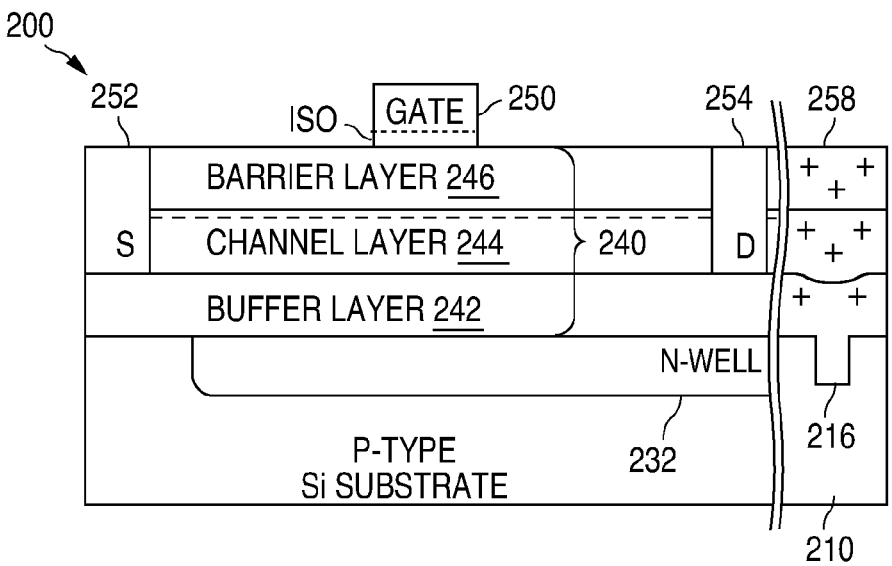

Alternately, as shown in FIG. 6, the method can isolate adjacent devices by implanting an isolating species, such as nitrogen, into the regions of the barrier layer 246 and channel layer 244 that lie over the alignment mark 216 and non-device regions. (The implant also drives the isolating species part way into the buffer layer 242.) When the barrier layer 246 and channel layer 244 are implanted, the implant forms an implant isolation region 258 that lies above buffer layer 242, and touches and lies laterally between regions of the channel layer 244 and barrier layer 246.

Figure 7A:
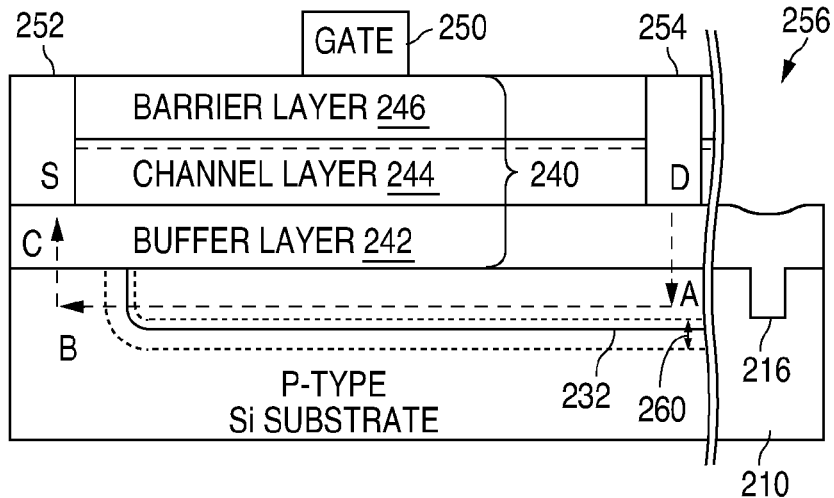
FIGS. 7A and 7B are cross-sectional views illustrating the operation of a single group III-N HEMT 200 and a pair of side-by-side group III-N HEMTS 200, respectively, in accordance with the present invention.
Figure 7B:
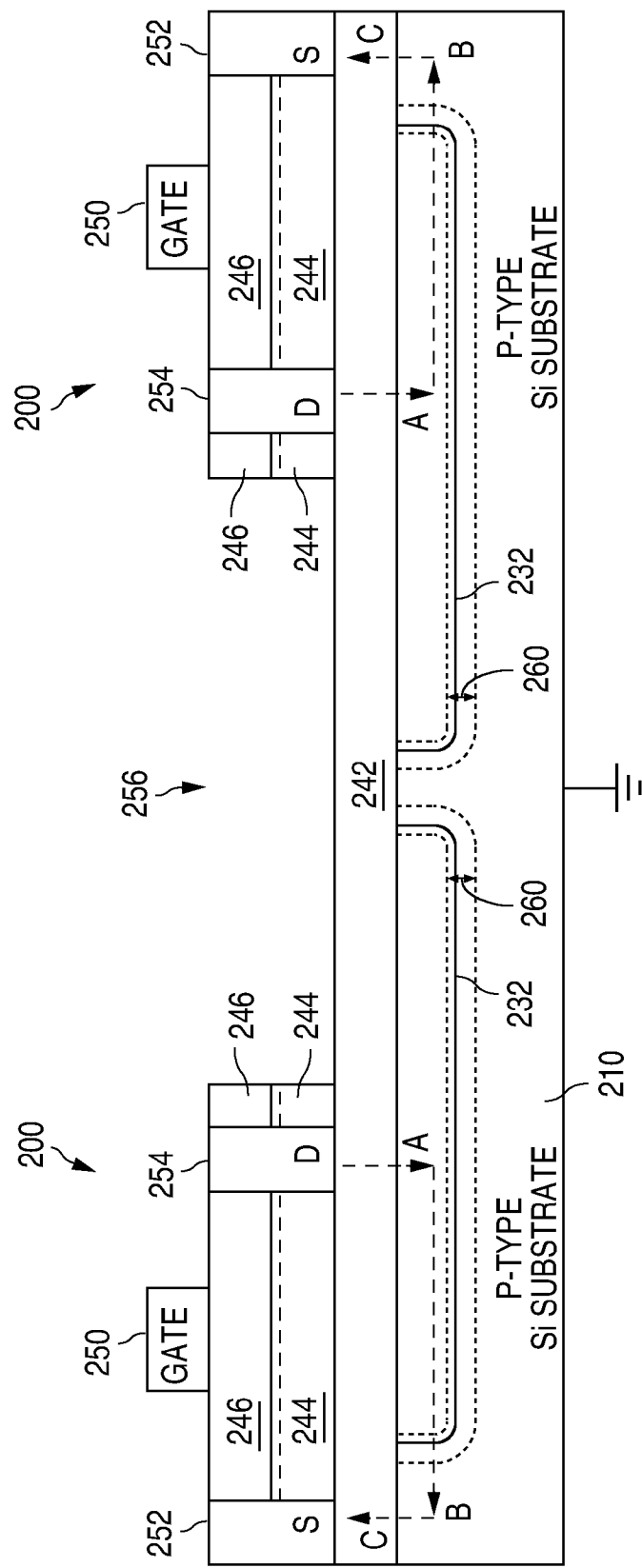

FIGS. 7A-7B show cross-sectional views that illustrate the operation of group III-N HEMT 200 in accordance with the present invention. FIG. 7A shows the operation of a single group III-N HEMT 200. As shown in FIG. 7A, when the drain-to-source breaks down, a breakdown current follows a path from the metal drain region 254 to the metal source region 252 that includes the breakdown path segments A, B, and C.

The formation of the n-well 232 in the p-substrate 210, however, forms a p-n junction with a depletion region 260 that interrupts the path segment B. The breakdown path A is still active, but as it turns on, it reverse-biases the p-n junction, thereby turning off breakdown paths B and C. Since it is the reverse-biased breakdown voltage of the p-n junction that increases the buffer breakdown voltage, the dopant concentration used to form the n-well 232 is selected to maximize the reverse-biased breakdown voltage.

Thus, one of the advantages of the present invention is that by forming a p-n junction below the metal drain region 254, the buffer breakdown voltage can be substantially increased when a thin buffer layer (e.g., 2-3 um thick) is grown on a Si substrate. An improved buffer breakdown voltage, in turn, provides a higher breakdown voltage for the group III-N HEMT 200.

FIG. 7B shows the operation of a pair of side-by-side group III-N HEMTS 200. As shown in FIG. 7B, each drain 254 of a group III-N HEMT 200 is centered over a corresponding n-well 232. The n-well 232, in turn, can extend laterally to the left as far as the source 252 of the group III-N HEMT 200, and to the right an equivalent distance to a point which, as shown in FIG. 7B, coincides approximately with the mid-point between the gates of an adjacent pair of group III-N HEMTs 200.

The width of n-well 232 is experimentally determined to ensure that any breakdown current that flows from a drain 254 to buffer layer 242 to substrate 210, thereby going around the p-n junction of the corresponding n-well 232, has dropped a voltage that is approximately equivalent to the reverse-biased breakdown voltage of n-well 232. Since a group III-N HEMT 200 is a lateral high-voltage transistor, which has vertical dimensions that are relatively smaller than the lateral dimensions, the transistor has lateral dimensions that are sufficiently large to accommodate the width of n-well 232.

As further shown in FIG. 7B, the p-n junction allows the n-well 232 to electrically float, and allows the p-type substrate 210 to be electrically grounded. Thus, another advantage of the present invention is that grounding p-type substrate 210 reduces crosstalk between adjacent devices. In addition, grounding p-type substrate 210 allows a conductive epoxy, which provides better thermal conductivity than a non-conductive epoxy, to be used to attach the group III-N HEMTS 200 to a package.

FIGS. 8-12 show a series of cross-sectional views that illustrate an example of a method of forming a group III-N HEMT 800 in accordance with a first alternative embodiment of the present invention. The method of forming group III-N HEMT 800 is the same as the method of forming group III-N HEMT 200 up through the removal of the patterned photoresist layer 212 and, as a result, utilizes the same reference numerals to designate the structures which are common to both methods.

Figure 8:
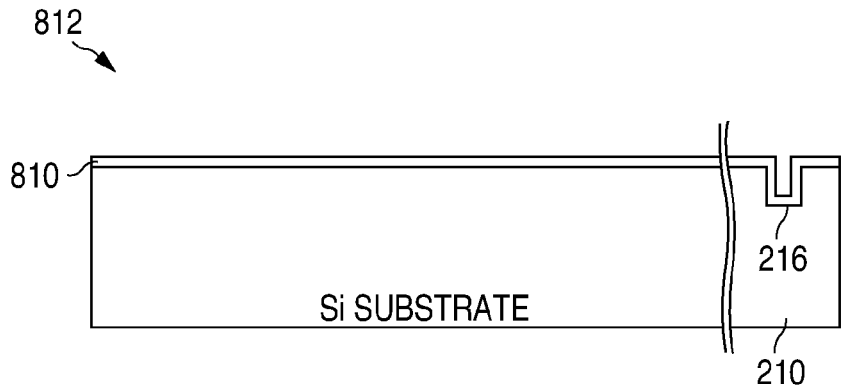
FIGS. 8-12 are a series of cross-sectional views illustrating an example of a method of forming a group III-N HEMT 800 in accordance with a first alternate embodiment of the present invention.

As shown in FIG. 8, once the patterned photoresist layer 212 has been removed, a first buffer layer 810 is formed, for example, by placing the intermediate HEMT structure 214 in a MOCVD reactor and epitaxially growing the first buffer layer 810 on the top surface of the substrate 210 in a conventional manner. The growth of the first buffer layer 810, which is substantially thinner than the buffer layer 242, forms an intermediate HEMT structure 812. The first buffer layer 810 can be implemented with one or more sequential group-III nitride layers, with the group-III including one or more of In, Ga, and Al. The first buffer layer 810 is preferably implemented with a thermally-stable material, such as AlN or a sequence of one or more group III-N materials with the top layer having a high Al composition (e.g., above 50%).

Figure 9:
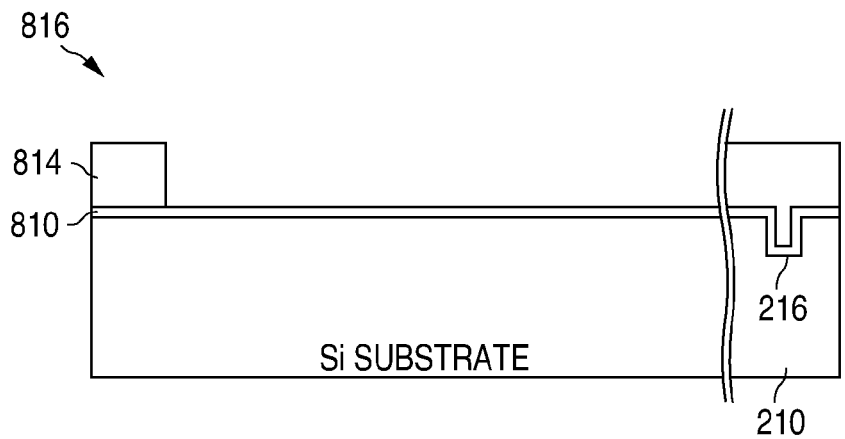

As shown in FIG. 9, after the first buffer layer 810 has been formed, the intermediate HEMT structure 812 is removed from the reactor and a patterned photoresist layer 814 is formed on the top surface of the first buffer layer 810 in a conventional manner. After the patterned photoresist layer 814 has been formed, an n-type dopant, such as phosphorous and/or arsenic, is implanted through the openings in the patterned photoresist layer 814 and through the first buffer layer 810 to form an n-type implanted region in the substrate 210. The dopant concentration of the implant can be selected to be approximately equal to the dopant concentration used to form the n-well 232.

Following this, an n-type dopant, such as Si, is implanted into the first buffer layer 810 through the openings in the patterned photoresist layer 814 to form an n-type implanted region in the first buffer layer 810. The dopant concentration of the implant can be selected to be approximately equal to the dopant concentration used to form the n-well 232. The patterned photoresist layer 814 is then removed to form an intermediate HEMT structure 816.

Figure 10:
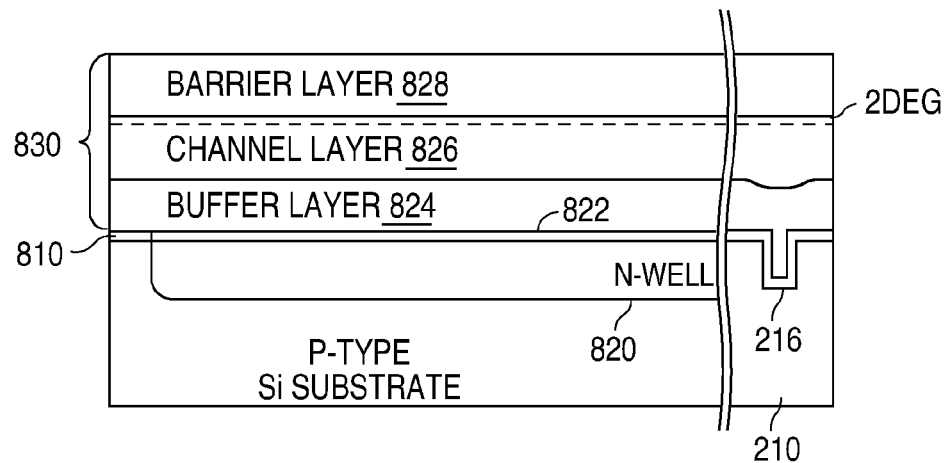

As shown in FIG. 10, once the patterned photoresist layer 814 has been removed, the intermediate HEMT structure 816 is returned to the reactor, and an anneal is performed to diffuse and activate the implanted dopants, thereby forming an n-well 820 in the substrate 210, and an n-type region 822 in the first buffer layer 810 that lies over and touches the n-well 820.

(The n-well 820 and the n-type region 822 can alternately be formed using separate masks. For example, the n-well can be formed before the first buffer layer 810 has been formed using the patterned photoresist layer 220 as illustrated in FIG. 3 so that the patterned photoresist layer 814 illustrated in FIG. 9 is only used to form the n-type region 822.)

Following the anneal, a second buffer layer 824 is formed by epitaxially growing the second buffer layer 824 on the top surface of the first buffer layer 810 in a conventional manner. The thickness of the first buffer layer 810 and the thickness of the second buffer layer 824 are approximately equal to the thickness of the buffer layer 242.

Once the second buffer layer 824 has been formed, a channel layer 826 is epitaxially grown on the second buffer layer 824, and a barrier layer 828 is epitaxially grown on the channel layer 826 in a conventional manner.

The second buffer layer 824, the channel layer 826, and the barrier layer 828 can each be implemented with one or more sequential group-III nitride layers, with the group-III including one or more of In, Ga, and Al.

For example, the second buffer layer 824 can be formed with sequential layers of AlGaN and GaN, the channel layer 826 can be formed from GaN, and the barrier layer 828 can be formed from AlGaN. The first buffer layer 810, the second buffer layer 824, the channel layer 826, and the barrier layer 828 form a layered region 830.

Figure 11:
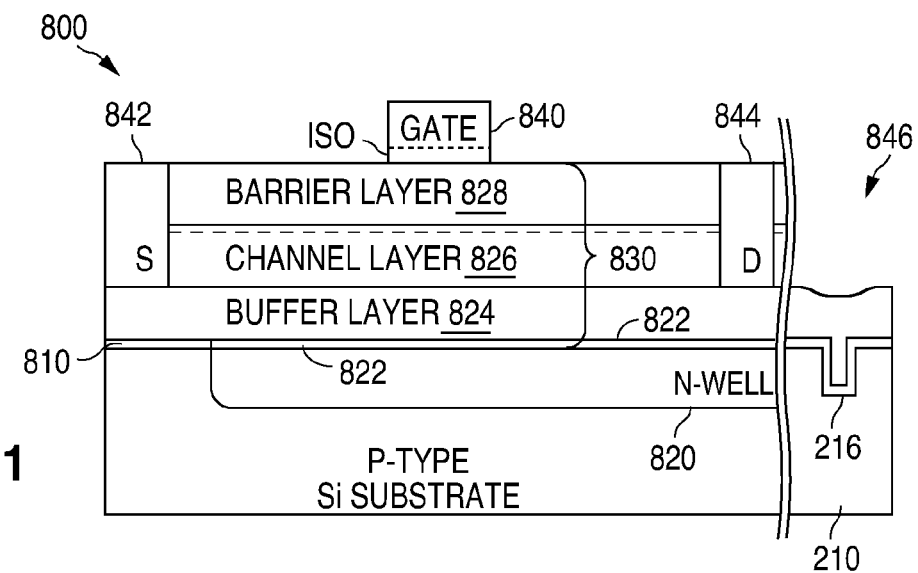

As shown in FIG. 11, following the conventional formation of the barrier layer 828, the method completes the formation of group III-N HEMT 800 by forming a metal gate region 840, a metal source region 842, and a metal drain region 844 in a conventional fashion, except that the alignment mark 216 is used to position the metal drain region 844 directly over the n-well 820 and the n-type region 822.

The metal gate region 840 is formed to make a Schottky contact, while the metal source region 842 and the metal drain region 844 are formed to make an ohmic contact with the channel layer 826. Alternately, as shown by the dashed line in FIG. 11, the gate 840 can be isolated from the barrier layer 828 by an insulating layer ISO.

In addition, the method isolates adjacent devices by removing the barrier layer 828 and the channel layer 826 that lie over the alignment mark 216 and non-device regions. When the barrier layer 828 and channel layer 826 are removed from over the alignment mark 216 and non-device regions, the removal forms an opening 846, where the bottom of the opening 846 exposes a portion of buffer layer 824, and a side wall of the opening 846 exposes a portion of the channel layer 826 and barrier layer 828.

Figure 12:
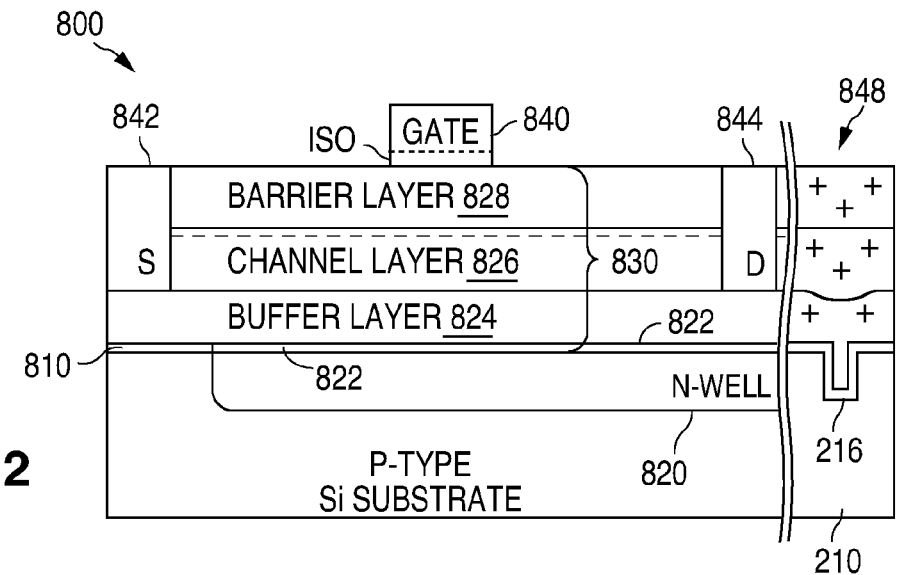

Alternately, as shown in FIG. 12, the method can isolate adjacent devices by implanting an isolating species, such as nitrogen, into the regions of the barrier layer 828 and channel layer 826 that lie over the alignment mark 216 and non-device regions. (The implant also drives the isolating species part way into the buffer layer 824.) When the barrier layer 828 and channel layer 826 are implanted, the implant forms an implant isolation region 848 that lies above buffer layer 824, and touches and lies laterally between regions of the channel layer 826 and barrier layer 828.

Thus, one of the advantages of the first alternate embodiment of the present invention is that forming the n-type region 822 in the first buffer layer 810 directly above the n-well 820 minimizes any leakage current that may be present at the interface between the substrate 210 and the buffer layer. Otherwise group III-N HEMT 800 operates the same as group III-N HEMT 200.

FIGS. 13-16 show cross-sectional views that illustrate an example of a method of forming a group III-N HEMT 1300 in accordance with a second alternate embodiment of the present invention. The method of forming group III-N HEMT 1300 is the same as the method of forming group III-N HEMT 800 up through the removal of the patterned photoresist layer 814 and, as a result, utilizes the same reference numerals to designate the structures which are common to both methods.

Figure 13:
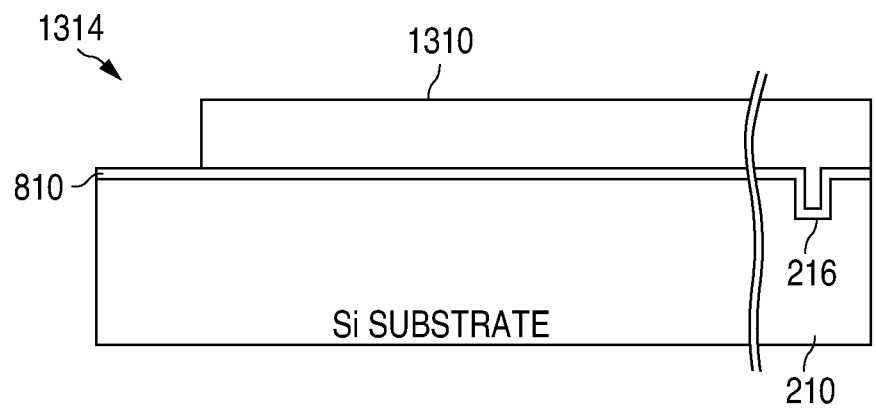
FIGS. 13-16 are a series of cross-sectional views illustrating an example of a method of forming a group III-N HEMT 1300 in accordance with a second alternate embodiment of the present invention.

As shown in FIG. 13, following the removal of the patterned photoresist layer 814, a patterned photoresist layer 1310 is formed on the first buffer layer 810 in a conventional manner. After the patterned photoresist layer 1310 has been formed, a p-type dopant, such as Mg, is implanted into the first buffer layer 810 through the openings in the patterned photoresist layer 1310 to form an implanted region in the first buffer layer 810.

The dopant concentration used to form the implanted region can be selected to be approximately equal to the dopant concentration used to form the p-type substrate 210. The patterned photoresist layer 1310 is then removed to form an intermediate HEMT structure 1314. (The patterned photoresist layer 1310 can optionally be formed before the patterned photoresist layer 814 is formed.)

Figure 14:
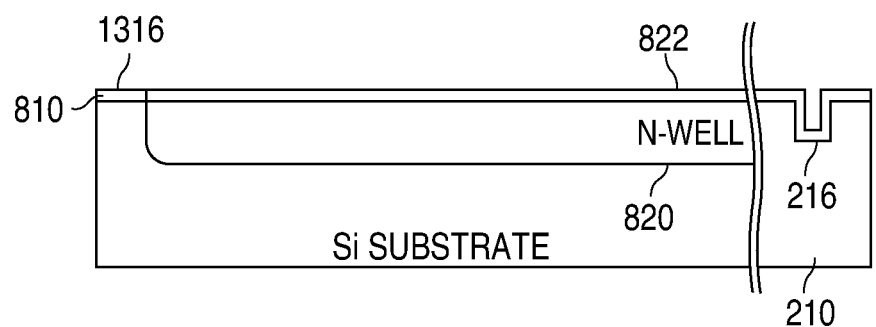

As shown in FIG. 14, after the patterned photoresist layer 1310 has been removed, the intermediate HEMT structure 1314 is returned to the reactor, and an anneal is performed to diffuse and activate the implanted dopants, thereby forming an n-well 820 in the substrate 210, an n-type region 822 in the first buffer layer 810 that lies over and touches the n-well 820, and a p-type region 1316 in the first buffer layer 810. Following the diffusion, as shown in FIG. 14, the p-type region 1316 touches the n-type region 822, thereby forming a p-n junction in the first buffer layer 810.

Figure 15:
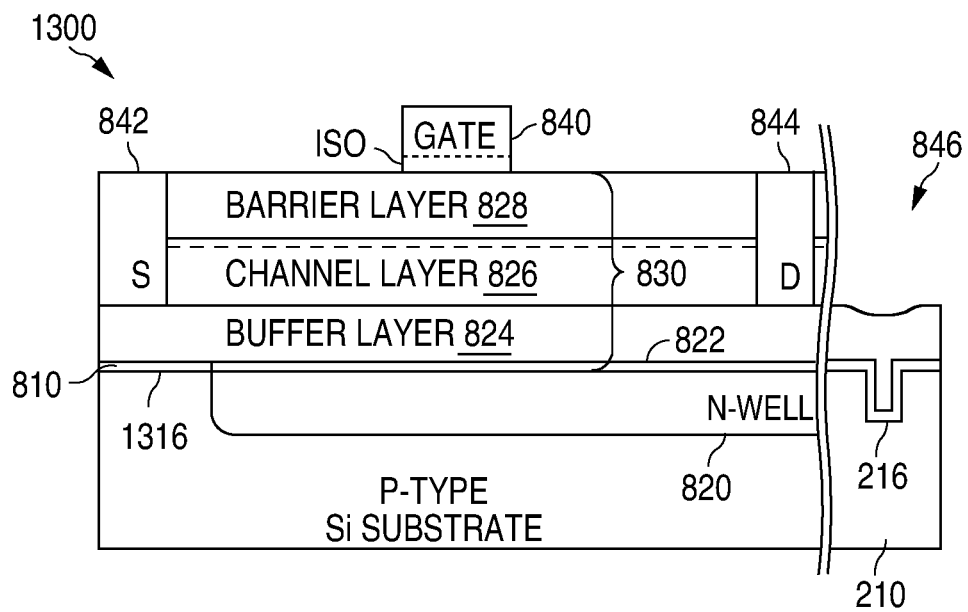

As shown in FIG. 15, after the anneal has been completed, the method continues as described with the first alternate embodiment to form group III-N HEMT 1300, i.e., by forming the second buffer layer 824, the channel layer 826, and the barrier layer 828, and the metal contacts 840, 842, and 844.

Thus, one of the advantages of the second alternate embodiment of the present invention is that forming a p-n junction in the first buffer layer 810 with the p-type region 1316 and the n-type region 822 further minimizes any leakage current that may be present at the interface between the substrate 210 and the buffer layer.

Figure 16:
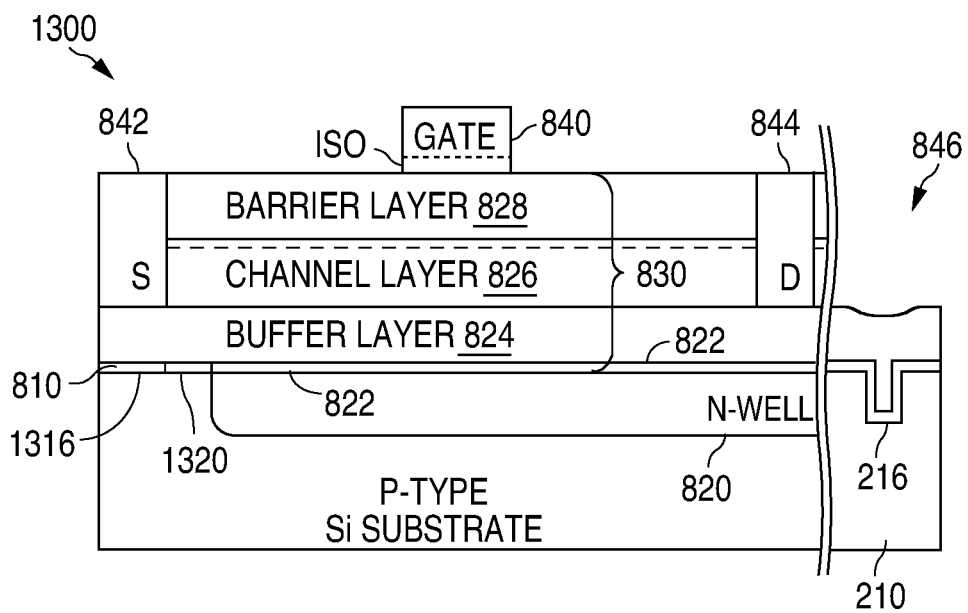

Alternately, as shown in FIG. 16, the patterned photoresist layer 1310 can be positioned so that after the anneal, the diffused p-type dopant does not extend over to touch the diffused n-type dopant that forms the n-type region 822, thereby forming a gap 1320 between p-type region 1316 and n-type region 822. Otherwise, both variations of group III-N HEMT 1300 operate the same as group III-N HEMT 800.

It should be understood that the above descriptions are examples of the present invention, and that various alternatives of the invention described herein may be employed in practicing the invention. For example, group III-N HEMTs are conventionally formed as depletion-mode devices, but can also be formed as enhancement-mode devices.

The present invention applies equally well to enhancement-mode devices as the substrate and buffer layer structures of these devices are the same. Therefore, it is intended that the following claims define the scope of the invention and that structures and methods within the scope of these claims and their equivalents be covered thereby.

What is claimed is:

1. A method of forming a transistor with increased buffer breakdown voltage comprising:
    forming a substrate of a first conductivity type, the substrate having a top surface;
    forming a well of a second conductivity type in the substrate, the well having a top surface;
    forming a buffer layer to touch the top surface of the substrate and the top surface of the well, the buffer layer having a top surface;
    forming a channel layer to touch the top surface of the buffer layer, the channel layer including a group III-nitride and having a top surface;
    forming a barrier layer to touch the top surface of the channel layer, the barrier layer including a group III-nitride;
    forming spaced-apart metal source and drain regions that make ohmic contact with the channel and barrier layers, the metal drain region lying directly over the well;
    wherein the well is under the drain region and not under the source region, and also wherein a junction formed by the substrate and the well form a junction isolation barrier that acts in series with, and thereby increases the buffer breakdown voltage.

2. The method of claim 1 wherein the metal drain region is spaced apart from the well.

3. The method of claim 1 and further comprising removing a portion of the barrier layer and the channel layer to form an opening, a bottom of the opening exposing a portion of the buffer layer, a side wall of the opening exposing a portion of the channel layer and the barrier layer.

4. The method of claim 1 and further comprising forming an alignment mark opening in the substrate, the metal drain region having a predefined spatial relationship to the alignment mark opening.

5. The method of claim 1 and further comprising forming a metal gate to touch the barrier layer to form a Schottky contact, or be separated from the barrier layer by an insulating layer.

6. The method of claim 1 wherein forming the buffer layer includes:
    forming a first buffer layer to touch the top surface of the substrate and the top surface of the well, the first buffer layer having a top surface;
    forming a region of the second conductivity type in the first buffer layer; and
    forming a second buffer layer to touch the top surface of the first buffer layer, the channel layer touching a top surface of the second buffer layer.

7. The method of claim 6 wherein the first buffer layer is thinner than the second buffer layer.

8. The method of claim 6 wherein the region of the second conductivity type in the first buffer layer lies directly over and touches the well.

9. The method of claim 6 and further comprising forming a region of the first conductivity type in the first buffer layer.

10. The method of claim 9 wherein the region of the first conductivity type in the first buffer layer touches the region of the second conductivity type in the first buffer layer.

11. A transistor with increased buffer breakdown voltage comprising:
    a substrate of a first conductivity type, the substrate having a top surface;
    a well of a second conductivity type located in the substrate, the well having a top surface;
    a buffer layer that touches the top surface of the substrate and the top surface of the well, the buffer layer having a top surface;
    a channel layer that touches the top surface of the buffer layer, the channel layer including a group III-nitride and having a top surface;
    a barrier layer that touches the top surface of the channel layer, the barrier layer including a group III-nitride;
    spaced-apart metal source and drain regions that make ohmic contact with the channel and barrier layer, the metal drain region lying directly over the well;
    wherein the well is under the drain region and not under the source region, and also wherein a junction formed by the substrate and the well form a junction isolation barrier that acts in series with, and thereby increases the buffer breakdown voltage.

12. The transistor of claim 11 wherein the metal drain region is spaced apart from the well.

13. The transistor of claim 11 and further comprising an implant isolation region that touches the buffer layer, and touches and lies laterally between regions of the channel layer and the barrier layer.

14. The transistor of claim 11 and further comprising an alignment mark opening located in the substrate, the metal drain region having a predefined spatial relationship to the alignment mark opening.

15. The transistor of claim 11 and further comprising a metal gate that touches the barrier layer, or is separated from the barrier layer by an insulating layer.

16. The transistor of claim 11 wherein the buffer layer includes:
    a first buffer layer that touches the top surface of the substrate and the top surface of the well;

a region of the second conductivity type located in the first buffer layer; and a second buffer layer that touches the first buffer layer, the channel layer touching a top surface of the second buffer layer.

17. The transistor of claim 16 wherein the first buffer layer is thinner than the second buffer layer.

18. The transistor of claim 16 wherein the region of the second conductivity type located in the first buffer layer lies directly over and touches the well.

19. The transistor of claim 16 and further comprising a region of the first conductivity type located in the first buffer layer.

20. The transistor of claim 19 wherein the region of the first conductivity type located in the first buffer layer touches the region of the second conductivity type located in the first buffer layer.

\* \* \* \* \*